United States Patent
Katrak

(10) Patent No.: US 10,338,145 B2
(45) Date of Patent: *Jul. 2, 2019

(54) VOLTAGE MONITORING SYSTEM

(71) Applicant: LG Chem, Ltd., Seoul (KR)

(72) Inventor: Kerfegar K. Katrak, Fenton, MI (US)

(73) Assignee: LG Chem, Ltd., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/657,305

(22) Filed: Jul. 24, 2017

(65) Prior Publication Data
US 2019/0025378 A1 Jan. 24, 2019

(51) Int. Cl.
*G01R 19/25* (2006.01)
*G01R 31/36* (2019.01)
*G06F 1/28* (2006.01)
*G01R 19/165* (2006.01)
*G01R 31/00* (2006.01)
*H02P 9/30* (2006.01)
*H02J 7/16* (2006.01)

(52) U.S. Cl.
CPC ..... *G01R 31/3648* (2013.01); *G01R 19/16504* (2013.01); *G01R 19/2513* (2013.01); *G01R 31/006* (2013.01); *G06F 1/28* (2013.01); *H02J 7/16* (2013.01); *H02P 9/305* (2013.01)

(58) Field of Classification Search
CPC .............. G01R 31/3648; G01R 19/2513
USPC ........................................ 324/76.11
See application file for complete search history.

(56) References Cited

U.S. PATENT DOCUMENTS

| 8,253,419 | B2 | 8/2012 | Heeringa et al. | |
| 9,444,332 | B2* | 9/2016 | Bizjak | H02M 3/156 |
| 9,935,552 | B2* | 4/2018 | Katrak | H02J 7/0065 |
| 2019/0025352 | A1* | 1/2019 | Katrak | G01R 19/2513 |

OTHER PUBLICATIONS

U.S. Appl. No. 15/657,441 filed Jul. 24, 2017 entitled Voltage Monitoring System Utilizing First and Second Banks of Channels and Exchanged Channel Numbers for Taking Redundant Safe Action.
U.S. Appl. No. 15/657,357, filed Jul. 24, 2017 entitled Voltage Monitoring System Utilizing a Common Channel and Exchanged Encoded Channel Numbers to Confirm Valid Voltage Values.

* cited by examiner

*Primary Examiner* — Reena Aurora
(74) *Attorney, Agent, or Firm* — Buckert Patent & Trademark Law Firm PC; John F. Buckert

(57) ABSTRACT

A voltage monitoring system having a microcontroller with an analog-to-digital converter with a first channel, and a memory device is provided. The microcontroller includes a monitoring application and a hardware abstraction layer. The monitoring application sends a first encoded channel number to the hardware abstraction layer. The hardware abstraction layer determines a first channel number based on the first encoded channel number, and obtains a measured voltage value associated with the first channel number. The hardware abstraction layer sends a second encoded channel number and the measured voltage value therein to the monitoring application. If the first encoded channel number is equal to the second encoded channel number, then the monitoring application stores the measured voltage value in the memory device.

9 Claims, 4 Drawing Sheets

FIRST TABLE

| ENCODED CHANNEL NUMBER | CHANNEL NUMBER |
|---|---|
| D1 | 8 |

SECOND TABLE

| CHANNEL NUMBER | ENCODED CHANNEL NUMBER |
|---|---|
| 8 | D1 |

VOLTAGE MONITORING SYSTEM

BACKGROUND

The inventor herein has recognized a need for an improved voltage monitoring system since other systems may inadvertently obtain incorrect voltage values from incorrect voltage channels due to software errors or a malfunctioning microcontroller, and may not be able to detect that incorrect voltage values were obtained.

The improved voltage monitoring system described herein utilizes a pair of encoded channel numbers to confirm that the system is reliably obtaining a desired voltage value from a specific/correct channel of an analog-to-digital converter.

SUMMARY

A voltage monitoring system in accordance with an exemplary embodiment is provided. The voltage monitoring system includes a microcontroller having an analog-to-digital converter and a memory device. The microcontroller further includes a monitoring application and a hardware abstraction layer. The analog-to-digital converter has a first channel that is electrically coupled to a voltage source. The monitoring application sends a request message to the hardware abstraction layer that requests a measured voltage value from the first channel. The request message has a first encoded channel number associated with the first channel. The hardware abstraction layer determines a first channel number of the first channel based on the first encoded channel number. The hardware abstraction layer obtains a measured voltage value associated with the first channel number from the analog-to-digital converter. The hardware abstraction layer determines a second encoded channel number based on the first channel number. The hardware abstraction layer sends a response message having the second encoded channel number and the measured voltage value therein to the monitoring application. The monitoring application compares the first encoded channel number to the second encoded channel number, and if the first encoded channel number is equal to the second encoded channel number, then the monitoring application stores the measured voltage value in the memory device as a valid voltage value.

DETAILED DESCRIPTION

Figure 1:
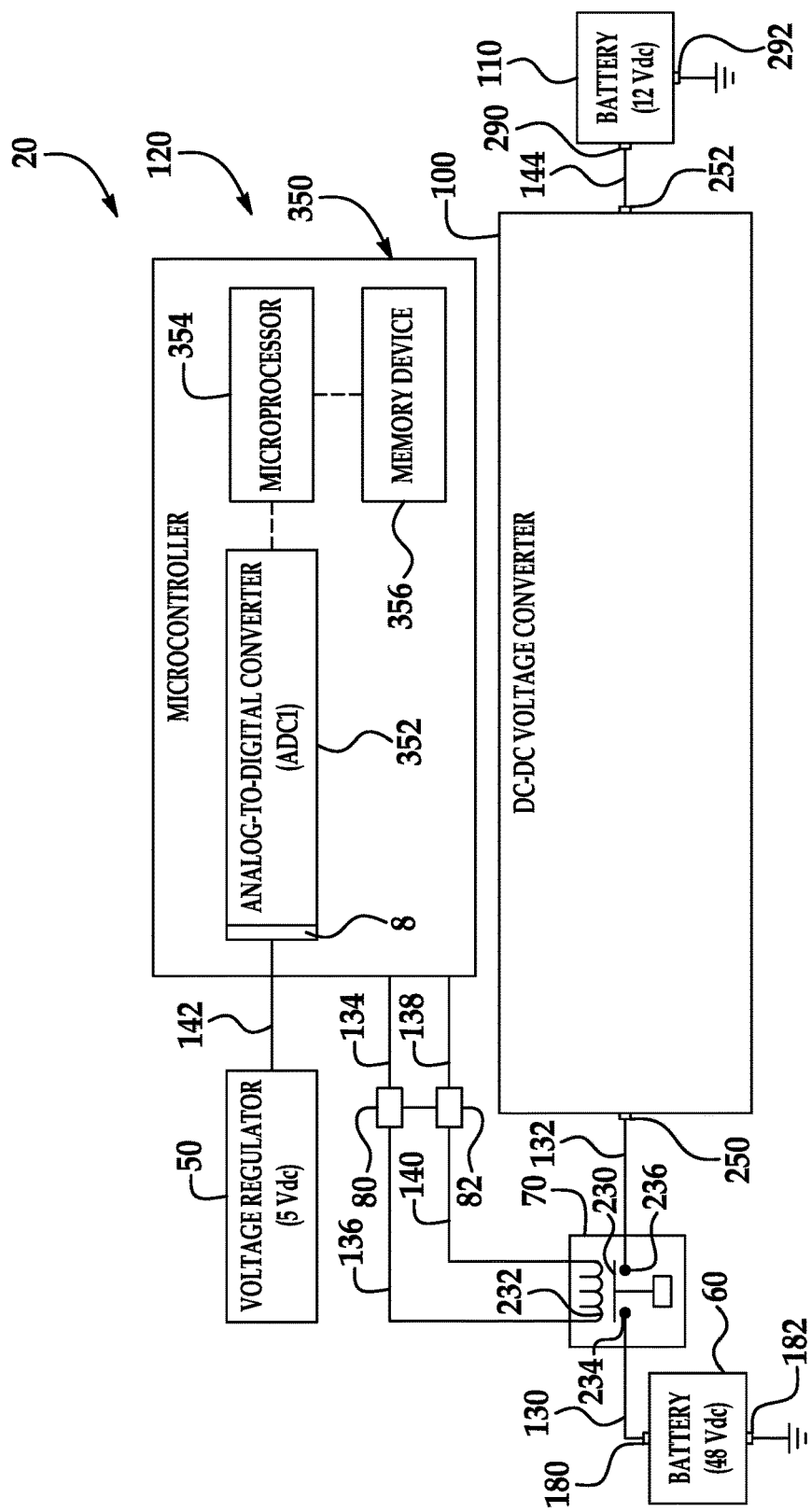
FIG. 1 is a schematic of a vehicle having a voltage monitoring system in accordance with an exemplary embodiment.

Referring to FIG. 1, a vehicle 20 is provided. The vehicle 20 includes a voltage regulator 50, a battery 60, a contactor 70, voltage drivers 80, 82, a DC-DC voltage converter 100, a battery 110, a voltage monitoring system 120, and electrical lines 130, 132, 134, 136, 138, 140, 142, 144.

An advantage of the voltage monitoring system 120 is that the system 120 utilizes a pair of encoded channel numbers to confirm that the system 120 is reliably obtaining a desired voltage value from a specific/correct channel of an analog-to-digital converter 352.

For purposes of understanding, a node is a region or a location in an electrical circuit.

The battery 60 includes a positive terminal 180 and a negative terminal 182. In an exemplary embodiment, the battery 60 generates 48 Vdc between the positive terminal 180 and the negative terminal 182. The positive terminal 180 is electrically coupled to a node 234 of the contactor 70. The negative terminal 182 is electrically coupled to electrical ground.

The contactor 70 has a contact 230, a contactor coil 232, a first node 234, and a second node 236. The first node 234 is electrically coupled to the positive terminal 180 of the battery 60 utilizing the electrical line 130. The second node 236 is electrically coupled to the first node 250 of the DC-DC voltage converter 100 utilizing the electrical line 132. When the microcontroller 350 generates first and second control signals that are received by the voltage drivers 80, 82, respectively, the contactor coil 232 is energized which transitions the contact 230 to a closed operational state. Alternately, when the microcontroller 350 generates third and fourth control signals that are received by the voltage drivers 80, 82, respectively, the contactor coil 232 is de-energized which transitions the contact 230 to an open operational state. In an exemplary embodiment, the third and fourth control signals can each be a ground voltage level.

The voltage drivers 80, 82 are provided to energize or de-energize the contactor coil 232. The voltage driver 80 is electrically coupled to the microcontroller 350 utilizing the electrical line 134. The voltage driver 80 is further electrically coupled to a first end of the contactor coil 232 utilizing the electrical line 136. The voltage driver 82 is electrically coupled to the microcontroller 350 utilizing the electrical line 138. The voltage driver 82 is further electrically coupled to a second end of the contactor coil 232 utilizing the electrical line 140.

The DC-DC voltage converter 100 has a first node 250 and a second node 252. The first node 250 is electrically coupled to the second node 236 of the contactor 70 utilizing the electrical line 132. The second node 236 is electrically coupled to the positive terminal 290 of the battery 110 utilizing the electrical line 144. In a first operational mode, the DC-DC voltage converter 100 outputs a voltage at the second node 252 for charging the battery 110. In a second operational mode, the DC-DC voltage converter 100 outputs a voltage at the first node 250 for charging the battery 60.

The battery 110 includes a positive terminal 290 and a negative terminal 292. In an exemplary embodiment, the battery 110 generates 12 Vdc between the positive terminal 290 and the negative terminal 292. The positive terminal 290 is electrically coupled to the second node 252 of the DC-DC voltage converter 100. The negative terminal 292 is electrically coupled to an electrical ground, which may be electrically isolated from the electrical ground associated with the battery 60.

The voltage monitoring system 120 is utilized to monitor a voltage from a voltage source, such as the voltage regulator 50 for example. The voltage monitoring system 120 includes a microcontroller 350 having an analog-to-digital converter 352, a microprocessor 354, and a memory device 356. The analog-to-digital converter 352 includes a channel 8 that is electrically coupled to the voltage regulator 50 utilizing the electrical line 142.

The analog-to-digital converter 352 measures a voltage from the voltage regulator 50 and generates a voltage value based on the measured voltage. In an exemplary embodiment, the voltage value is equal to a magnitude of the measured voltage. In an alternative embodiment, the voltage value is proportional to a magnitude of the measured voltage.

Figures 2, 3, 4:
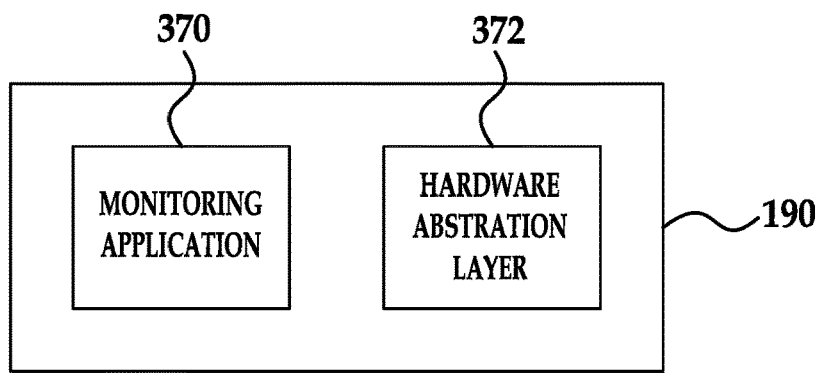
FIG. 2 is a first table stored in a memory device that is utilized by the voltage monitoring system of FIG. 1.
FIG. 3 is a second table stored in the memory device that is utilized by the voltage monitoring system of FIG. 1.
FIG. 4 is a block diagram illustrating a monitoring application and a hardware abstraction layer of the voltage monitoring system of FIG. 1.
Figure 5:
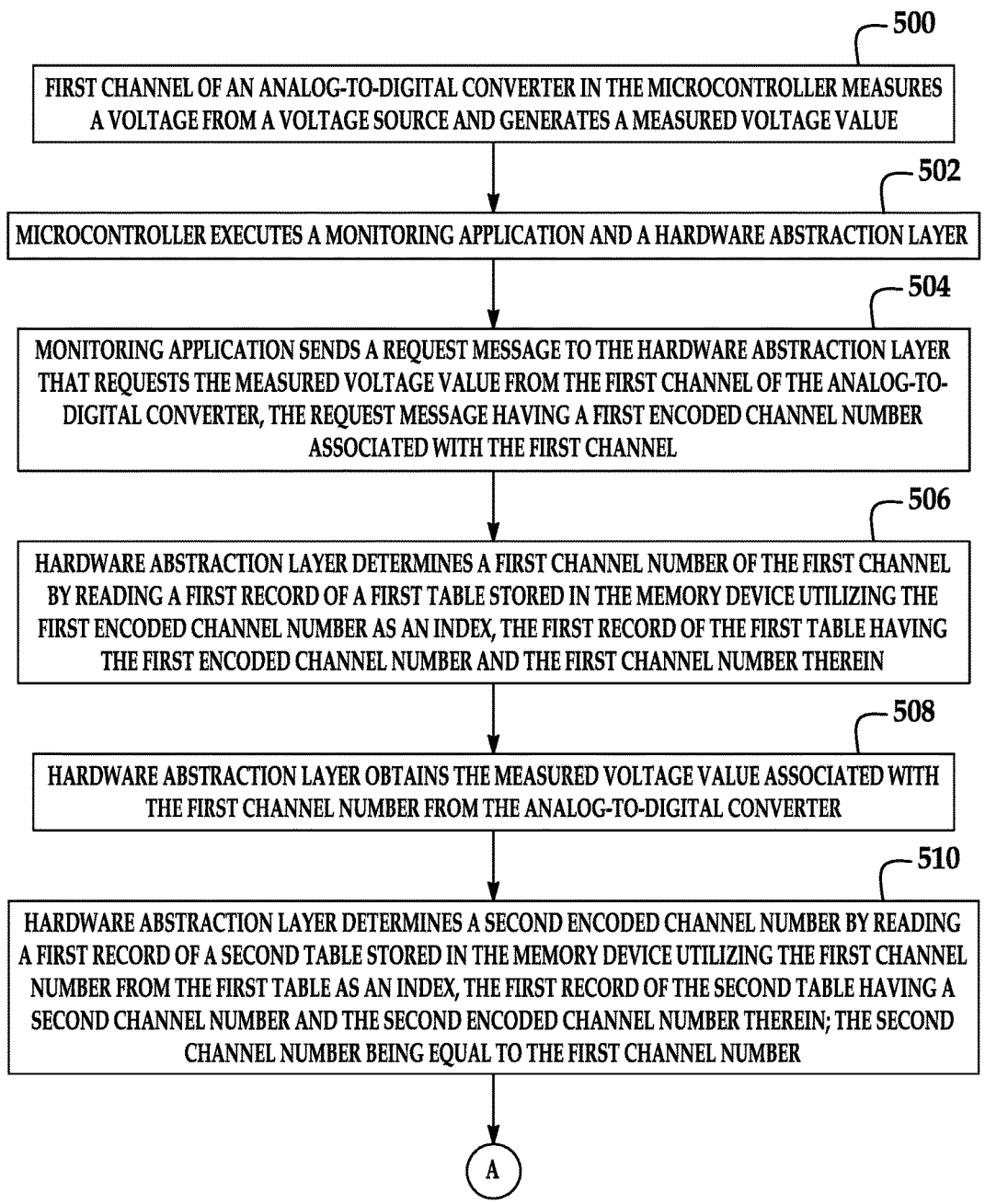
FIGS. 5 and 6 is a flowchart of a method for obtaining voltage measurements utilizing the voltage monitoring system of FIG. 1.
Figure 6:
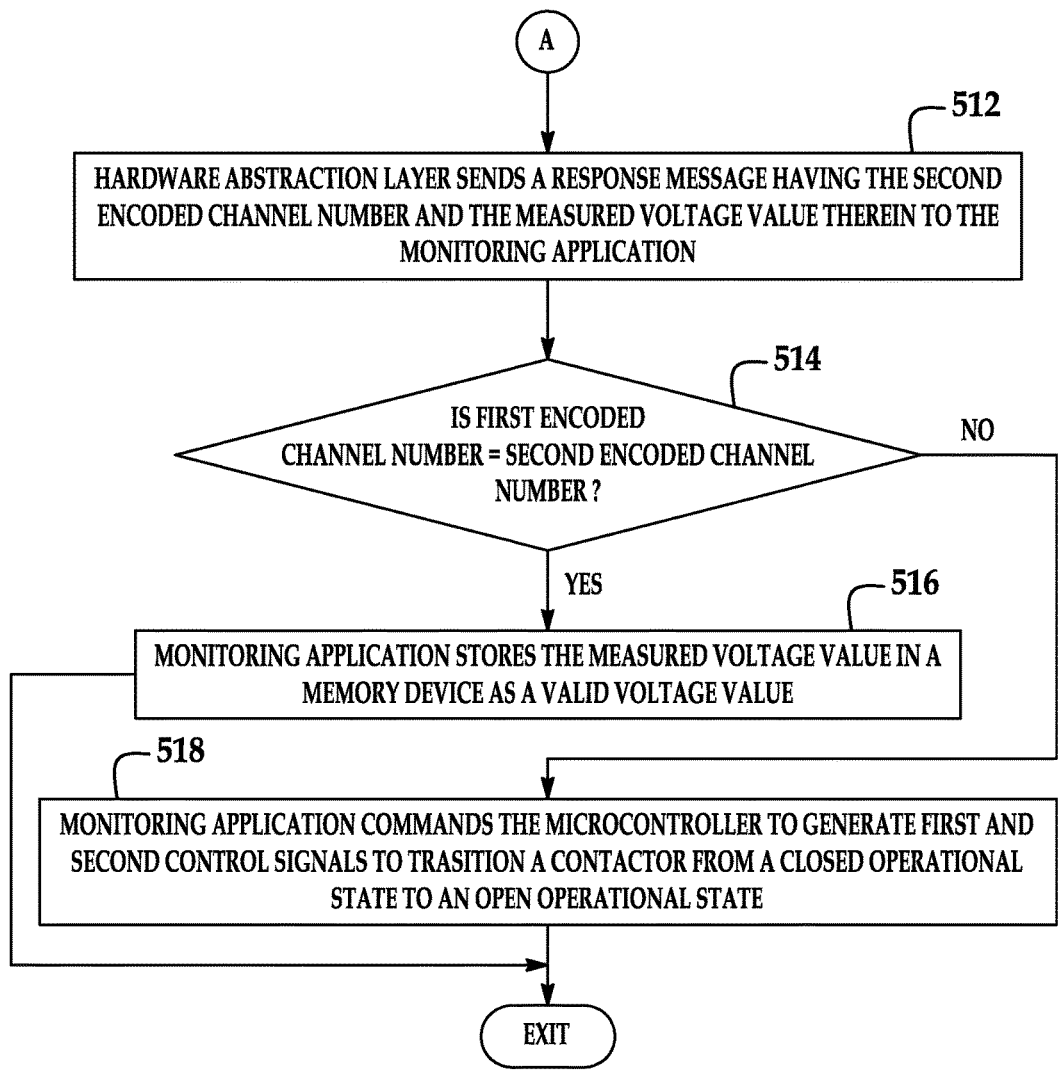

The microcontroller 350 is programmed to monitor voltages (described in flowcharts herein) utilizing the microprocessor 354 which executes software instructions stored in the memory device 356. The microprocessor 354 is operably coupled to the analog-to-digital converter 352, the memory device 356, the voltage drivers 80, 82, and the contactor 70. Referring to FIGS. 1 and 4, the microprocessor 354 further executes a monitoring application 370 and a hardware abstraction layer 372. The monitoring application 370 and the hardware abstraction layer 372 are implemented with software instructions that allow communication between the monitoring application 370 and the hardware abstraction layer 372 for obtaining voltage values from the analog-to-digital converter 352. The hardware abstraction layer 372 is associated with the analog-to-digital converter 352 and extracts voltage values generated by the analog-to-digital converter 352. In an exemplary embodiment, the hardware abstraction layer 372 is a layer of programming (e.g., low-level programs or applications) that allows the monitoring application 370 and an operating system (stored in the memory device 356) of the microcontroller 350 to interact with the analog-to-digital converter 352 at a general or abstract level rather than at a detailed hardware level. The hardware abstraction layer 372 can be called from the monitoring application 370 or the operating system to obtain voltage values from the analog-to-digital converter 352.

Referring to FIG. 2, a first table 400 utilized by the voltage monitoring system 120 is illustrated. The first table 400 includes a record 402. The record 402 has a first encoded channel number D1 (which is a hexadecimal value) and a first channel number 8 (which is the decimal value) which are associated with a channel 8 (shown in FIG. 1) herein. The channel 8 is electrically coupled to the voltage regulator 50. In an alternative embodiment, the channel 8 could be electrically coupled to another voltage source or other electrical device having a voltage.

Referring to FIG. 3, a second table 420 utilized by the voltage monitoring system 120 is illustrated. The second table 420 includes a record 422. The record 422 has a second channel number 8 (which is a decimal value), and a second encoded channel number D1 (which is a hexadecimal value) which are associated with a channel 8 (shown in FIG. 1) herein.

Referring to FIGS. 1 and 4-6, a flowchart of a method for obtaining voltage measurements utilizing the voltage monitoring system of FIG. 1 will now be explained.

At step 500, a first channel (e.g., channel 8) of the analog-to-digital converter 352 in the microcontroller 350 measures a voltage from a voltage source (e.g., voltage regulator 50) and generates a measured voltage value. After step 500, the method advances to step 502.

At step 502, the microcontroller 350 executes the monitoring application 370 and the hardware abstraction layer 372 which perform the following steps.

At step 504, the monitoring application 370 sends a request message to the hardware abstraction layer 372 that requests the measured voltage value from the first channel (e.g., channel 8) of the analog-to-digital converter 352. The request message has a first encoded channel number (e.g., D1) associated with the first channel (e.g., channel 8). After step 504, the method advances to step 506.

At step 506, the hardware abstraction layer 372 determines a first channel number (e.g., 8) of the channel 8 by reading the record 402 of the first table 400 (shown in FIG. 2) stored in the memory device 356 utilizing the first encoded channel number (e.g., D1) as an index. The record 402 of the first table 400 has the first encoded channel number (e.g., D1) and the first channel number (e.g., 8) therein. After step 506, the method advances to step 508.

At step 508, the hardware abstraction layer 372 obtains the measured voltage value associated with the first channel number (e.g., 8) from the analog-to-digital converter 352. After step 508, the method advances to step 510.

At step 510, the hardware abstraction layer 372 determines a second encoded channel number (e.g., 8) by reading the record 422 of the second table 420 (shown in FIG. 3) stored in the memory device 356 utilizing the first channel number (e.g., 8) from the first table 400 as an index. The record 422 of the second table 420 as a second channel number (e.g., 8) and the second encoded channel number (e.g., D1) therein. The second channel number (e.g., D1) is equal to the first channel number (e.g., D1) if the voltage monitoring system 120 is operating as desired. However, if the voltage monitoring system 120 is not operating as desired, it is possible that the retrieved second channel number would not be equal to the retrieved first channel number. After step 510, the method advances to the step 512.

At step 512, the hardware abstraction layer 372 sends a response message having the second encoded channel number (e.g., D1) and the measured voltage value therein to the monitoring application 370. After step 512, the method advances to step 514.

At step 512, the monitoring application makes a determination as to whether the first encoded channel number is equal to the second encoded channel number. If the value of step 514 equals "yes", the method advances to step 516. Otherwise, the method advances to step 518.

At step 516, the monitoring application 370 stores the measured voltage value in the memory device 356 as a valid voltage value. After step 516, the method is exited.

Referring to step 514, if the value of step 514 equals "no", the method advances to step 518. At step 518, the monitoring application 370 commands the microcontroller 350 to generate first and second control signals to transition the contactor 70 from a closed operational state to an open operational state. After step 518, the method is exited.

The voltage monitoring system 120 described herein provides a substantial advantage over other systems. In particular, the voltage monitoring system 120 utilizes a pair of encoded channel numbers to confirm that the system 120 is reliably obtaining a desired voltage value from a specific/correct channel of the analog-to-digital converter 350.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A voltage monitoring system, comprising:
a microcontroller having an analog-to-digital converter, a memory device, a monitoring application, and a hardware abstraction layer;
the analog-to-digital converter having a first channel that is electrically coupled to a voltage source;
the monitoring application sending a request message to the hardware abstraction layer utilizing a call instruction that requests a measured voltage value from the first channel, the request message having a first encoded channel number associated with the first channel;
the hardware abstraction layer determining a first channel number of the first channel by reading a first record of a first table stored in the memory device utilizing the first encoded channel number as an index, the first record of the first table having the first encoded channel number and the first channel number therein;
the hardware abstraction layer obtaining a measured voltage value associated with the first channel number from the analog-to-digital converter;
the hardware abstraction layer determining a second encoded channel number by reading a first record of a second table stored in the memory device utilizing the first channel number from the first table as an index, the first record of the second table having a second channel number and the second encoded channel number therein; the second channel number being equal to the first channel number, the second encoded channel number being associated with the first channel; and
the hardware abstraction layer sending a response message having the second encoded channel number and the measured voltage value therein to the monitoring application.

2. The voltage monitoring system of claim 1, wherein the electrical system further includes a contactor operably coupled to the microcontroller;
the monitoring application commanding the microcontroller to generate first and second control signals to transition the contactor from a closed operational state to an open operational state if the first encoded channel number is not equal to the second encoded channel number.

3. The voltage monitoring system of claim 1, wherein the first encoded channel number is a hexadecimal value.

4. The voltage monitoring system of claim 3, wherein the hexadecimal value is 1-byte in length.

5. The voltage monitoring system of claim 1, wherein the second encoded channel number is a hexadecimal value.

6. The voltage monitoring system of claim 5, wherein the hexadecimal value is 1-byte in length.

7. The voltage monitoring system of claim 1, wherein:
the monitoring application comparing the first encoded channel number to the second encoded channel number, and if the first encoded channel number is equal to the second encoded channel number, then the monitoring application storing the measured voltage value in the memory device as a valid voltage value.

8. A voltage monitoring system, comprising:
a microcontroller having an analog-to-digital converter, a memory device, and a hardware abstraction layer;
the analog-to-digital converter having a first channel that is electrically coupled to a voltage source;
the hardware abstraction layer determining a first channel number of the first channel by reading a first record of a first table stored in the memory device utilizing a first encoded channel number as an index, the first record of the first table having the first encoded channel number and the first channel number therein; and
the hardware abstraction layer obtaining a measured voltage value associated with the first channel number from the analog-to-digital converter.

9. The voltage monitoring system of claim 8, wherein the first encoded channel number is a hexadecimal value and the first channel number is a decimal value.

* * * * *